(12) United States Patent
Yu (10) Patent No.: US 8,689,405 B2
(45) Date of Patent: Apr. 8, 2014

(54) BIAXIAL PIVOTING MECHANISM AND ELECTRONIC DEVICE THEREOF

(71) Applicant: Wistron Corporation, New Taipei (TW)

(72) Inventor: Ching-Jen Yu, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 13/674,070

(22) Filed: Nov. 11, 2012

(65) Prior Publication Data

US 2013/0162128 A1 Jun. 27, 2013

(30) Foreign Application Priority Data

Dec. 23, 2011 (TW) .............................. 100148332 A (51) Int. Cl.
 E05D 3/10 (2006.01)
 G06F 1/16 (2006.01)
(52) U.S. Cl.
 USPC ......................................... 16/367; 312/223.1
(58) Field of Classification Search
 USPC .................. 16/366, 367; 361/679.26, 679.27, 361/679.28; 379/433.11, 433.13, 575.3; 248/917, 923, 288.1, 292.13, 291.1, 248/289.11; 455/575.3
 See application file for complete search history.

(56) References Cited

U.S. PATENT DOCUMENTS

| | | | |
|---|---|---|---|
| 6,845,546 B1* | 1/2005 | Lu et al. ........................... | 16/367 |
| 7,345,871 B2* | 3/2008 | Lev et al. .................. | 361/679.27 |
| 7,548,414 B2* | 6/2009 | Hung ........................ | 361/679.27 |
| 7,619,879 B2* | 11/2009 | Aoyama et al. .......... | 361/679.06 |
| 7,832,058 B2* | 11/2010 | Wang et al. ...................... | 16/367 |
| 7,996,959 B2* | 8/2011 | Chen et al. ....................... | 16/367 |
| 8,011,065 B2* | 9/2011 | Chen et al. ....................... | 16/367 |
| 8,011,066 B2* | 9/2011 | Zhang et al. .................... | 16/367 |
| 8,161,604 B2* | 4/2012 | Lin et al. .......................... | 16/367 |
| 2004/0008477 A1* | 1/2004 | Tseng et al. ................... | 361/681 |
| 2005/0005399 A1 | 1/2005 | Lu | |
| 2005/0060843 A1* | 3/2005 | Hung .............................. | 16/367 |
| 2005/0251965 A1* | 11/2005 | Lu et al. .......................... | 16/367 |
| 2006/0107492 A1* | 5/2006 | Chang et al. ..................... | 16/367 |

(Continued)

FOREIGN PATENT DOCUMENTS

TW I262261 9/2006

OTHER PUBLICATIONS

Office action mailed on Nov. 19, 2013 for the Taiwan application No. 100148332, filed Dec. 23, 2011, p. 1 line 12-14 and p. 2 line 1-25.

Primary Examiner — Victor Batson
Assistant Examiner — Jason W San
(74) Attorney, Agent, or Firm — Winston Hsu; Scott Margo (57) ABSTRACT

A biaxial pivoting mechanism includes a supporter disposed on a first module, a base connected to the supporter, a rotating component disposed between the supporter and the base. A track is formed on a lateral wall inside the base. The rotating component includes a shaft portion pivoting to the supporter, and a sheathing portion connected to the shaft portion. A hole is formed on the sheathing portion. The sheathing portion pivots to the supporter via the shaft portion for accommodating inside the accommodating space. The biaxial pivoting mechanism further includes a sleeve movably disposed inside the hole. The sleeve includes a protruding portion. The sleeve is rotated relative to the rotating portion by sliding the protruding portion along the track. The biaxial pivoting mechanism further includes a holder disposed on the sleeve for holding a second module.

20 Claims, 11 Drawing Sheets

(56) References Cited

U.S. PATENT DOCUMENTS

| | | | |
|---|---|---|---|
| 2006/0282985 A1* | 12/2006 | Lu et al. | 16/367 |
| 2007/0138363 A1* | 6/2007 | Hung | 248/291.1 |
| 2007/0169316 A1* | 7/2007 | Lu et al. | 16/367 |
| 2008/0078062 A1* | 4/2008 | Hsu et al. | 16/367 |
| 2009/0265890 A1* | 10/2009 | Endo et al. | 16/367 |
| 2011/0041634 A1* | 2/2011 | Kim et al. | 74/100.1 |
| 2011/0047751 A1* | 3/2011 | Chen | 16/303 |
| 2012/0034955 A1* | 2/2012 | Ahn | 455/566 |
| 2013/0162128 A1* | 6/2013 | Yu | 312/223.6 |

* cited by examiner

BIAXIAL PIVOTING MECHANISM AND ELECTRONIC DEVICE THEREOF

BACKGROUND OF THE INVENTION

1. Field of the Invention

The present invention relates to a biaxial pivoting mechanism, and more particularly, to a biaxial pivoting mechanism having small size volume and easy structure and an electronic device thereof.

2. Description of the Prior Art

A conventional biaxial pivoting mechanism is used as a central pivoting mechanism of a tablet notebook computer. A panel module of the tablet notebook computer can be unfolded relative to a host module, so that the user inputs information on a keyboard of the host module, and the information is displayed on the panel module. The above mentioned mode of the tablet notebook computer is called as a notebook computer mode. The panel module can also be rotated relative to the host module about 180 degrees and be folded to completely cover the host module, so that the user inputs information via a touch panel of the panel module, by which mode of the tablet notebook computer is called a tablet computer mode. Volume of the conventional biaxial pivoting mechanism is huge. Two ends of a connecting cable passes through a casing of the pivot to respectively connect to the panel module and the host module, so that the conventional biaxial pivoting mechanism has weak structural strength due to the imperfect casing. Besides, the casing of the pivot cannot cover the plurality of connecting cables, the connecting cables is hard to be arranged, and is abraded easily in rotation. Thus design of a pivoting mechanism having small-size volume, covering the cables preferably without abrasion, and capable of rotating in a multi-axial manner is an important issue of the mechanism industry.

SUMMARY OF THE INVENTION

The present invention provides a biaxial pivoting mechanism and an electronic device thereof having small volume and easy structure for solving above drawbacks.

According to the present invention, a biaxial pivoting mechanism includes a supporter disposed on a first module, a base connected to the supporter, and a rotating component disposed between the supporter and the base. A track is formed on a lateral wall inside the base. The rotating component includes a shaft portion pivoting to the supporter, and a sheathing portion connected to the shaft portion. A piercing hole is formed on the sheathing portion. The sheathing portion pivots relative to the supporter via the shaft portion along a first direction for accommodating inside the base. The biaxial pivoting mechanism further includes a sleeve slidably and rotatably disposed inside the piercing hole on the sheathing portion. The sleeve includes a protruding portion, the sleeve sliding inside the track by the protruding portion, so as to rotate relative to the rotating component along a second direction different from the first direction. The biaxial pivoting mechanism further includes a holder disposed on the sleeve for holding a second module so that the second module rotates relative to the first module along the first direction and the second direction.

According to the present invention, the supporter includes two conjunction portions, and a pivot hole is formed on each conjunction portion. The conjunction portions are respectively disposed on two ends of the shaft portion of the rotating component through the pivot holes.

According to the present invention, the rotating component further includes a cover portion disposed on a middle of the shaft portion, the sheathing portion is connected to the shaft portion via the cover portion, and a radial dimension of the cover portion is substantially greater than a radial dimension of the pivot hole on the conjunction portion.

According to the present invention, the base includes a buckling portion for buckling ends of the conjunction portions, so as to constrain a movement of the base relative to the supporter.

According to the present invention, the track of the base includes a first area, the sleeve sliding inside the first area by the protruding portion so as to rotate relative to the rotating component and the base along the second direction, a second area connected to an end of the first area, and a third area connected to the other end of the first area. The sleeve slides inside the second area by the protruding portion, so as to rotate relative to the supporter along the first direction with the rotating component. Directions of the second area and the third area are substantially perpendicular to a direction of the first area.

According to the present invention, the track further includes a buffer area disposed between the first area and the second area.

According to the present invention, a sunken slot and an engaging slot are formed on the rotating component, and are respectively located on two sides of the sheathing portion.

According to the present invention, the sleeve further includes a pillar piercing through the piercing hole on the sheathing portion, a top portion disposed on a top of the pillar for wedging with the sunken slot so as to constrain a movement of the pillar relative to the sheathing portion, a bottom portion disposed on a bottom of the pillar, the protruding portion being disposed on an edge of the bottom portion, and a fixing component for fixing the holder on the top portion of the sleeve.

According to the present invention, the biaxial pivoting mechanism further includes a resilient component disposed between the sleeve and the rotating component. The resilient component is disposed on the pillar of the sleeve, and two ends of the resilient respectively contact against the engaging slot on the sheathing portion and the bottom portion of the sleeve.

According to the present invention, an opening hole is formed on the holder, wire holes are formed on the sleeve and the base, and the opening hole on the holder aligns with the wire holes on the sleeve and the base.

According to the present invention, an electronic device includes a first module, a second module, and a biaxial pivoting mechanism disposed between the first module and the second module. The biaxial pivoting mechanism includes a supporter disposed on a first module, a base connected to the supporter, and a rotating component disposed between the supporter and the base. A track is formed on a lateral wall inside the base. The rotating component includes a shaft portion pivoting to the supporter, and a sheathing portion connected to the shaft portion. A piercing hole is formed on the sheathing portion. The sheathing portion pivots relative to the supporter via the shaft portion along a first direction for accommodating inside the base. The biaxial pivoting mechanism further includes a sleeve slidably and rotatably disposed inside the piercing hole on the sheathing portion. The sleeve includes a protruding portion, the sleeve sliding inside the track by the protruding portion, so as to rotate relative to the rotating component along a second direction different from the first direction. The biaxial pivoting mechanism further includes a holder disposed on the sleeve for holding a second module so that the second module rotates relative to the first module along the first direction and the second direction.

The biaxial pivoting mechanism of the present invention can rotate the second module relative to the first module along different directions, so that the electronic device can be switched to the tablet computer mode and the notebook computer mode according to user's demand. The biaxial pivoting mechanism of the present invention can pass the connecting cable through the holes on the above-mentioned elements for preferable structural strength, so as to keep stability of the first module and the second module. Therefore, the biaxial pivoting mechanism of the present invention has advantages of stable structure and preferred cover of the connecting cable, the biaxial pivoting mechanism has small volume for effectively economizing the structural space of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
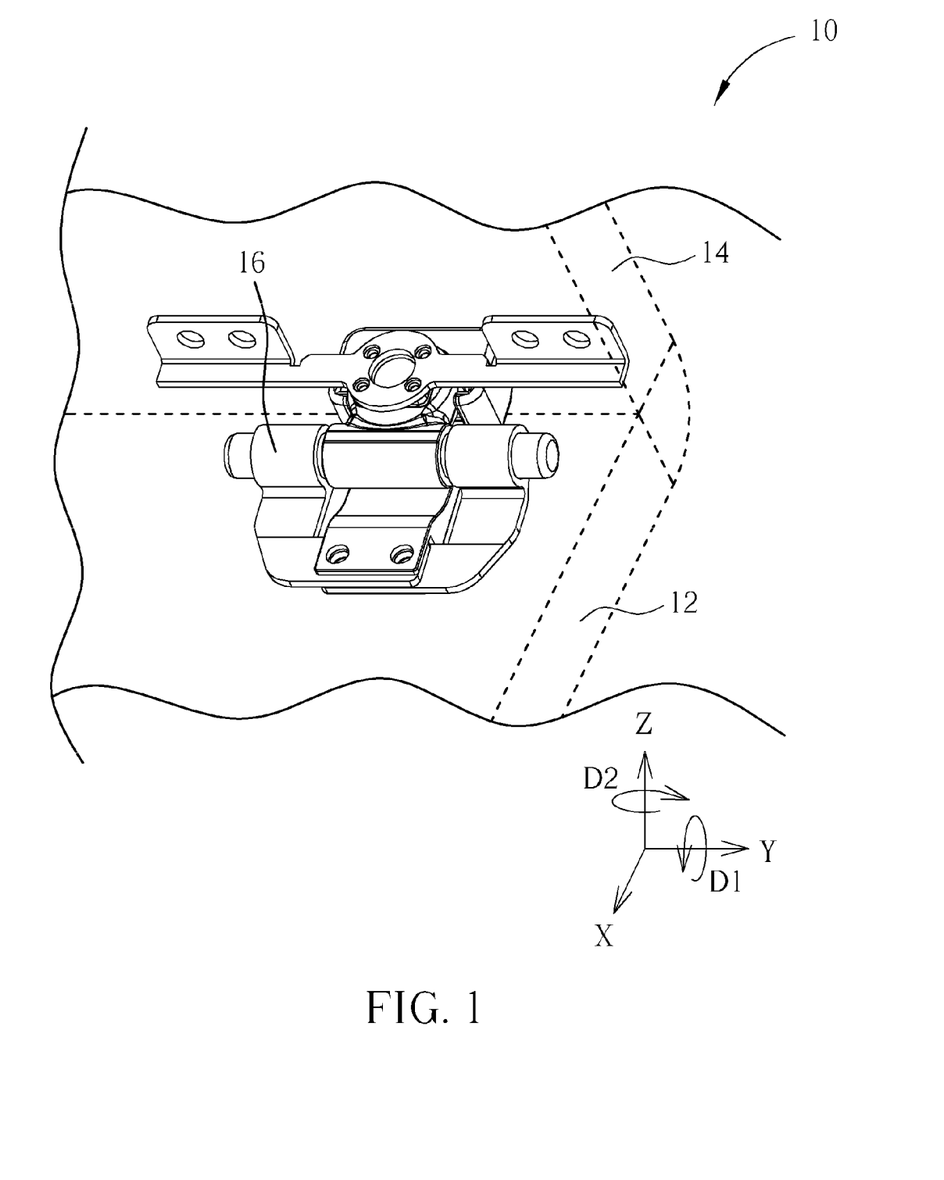
FIG. 1 and FIG. 2 respectively are diagrams of an electronic device in different views according to an embodiment of the present invention.
Figure 2:
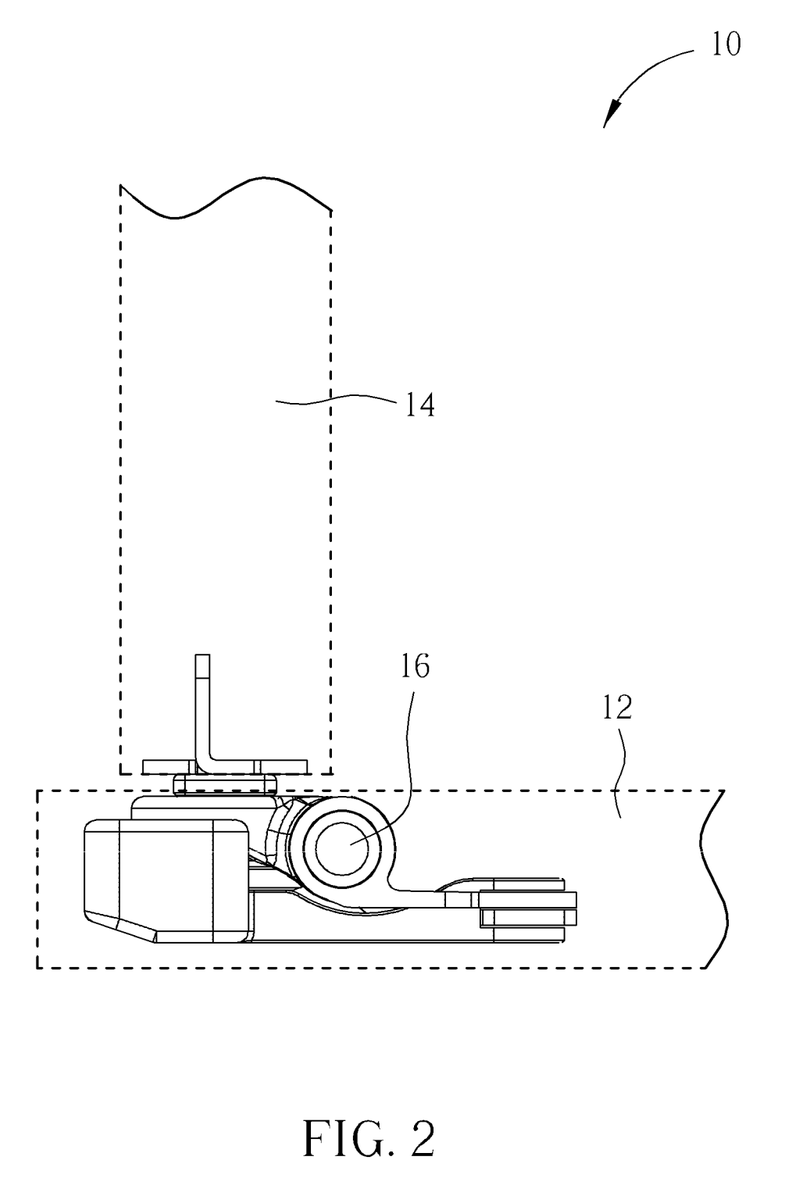

Please refer to FIG. 1 and FIG. 2. FIG. 1 and FIG. 2 are diagrams of an electronic device 10 in different views according to an embodiment of the present invention. The electronic device 10 can be a tablet notebook computer. The electronic device 10 includes a first module 12, a second module 14 and a biaxial pivoting mechanism 16. Generally, the first module 12 can be a host module, the second module 14 can be a panel module, and the biaxial pivoting mechanism 16 can be disposed between the first module 12 and the second module 14. The second module 14 (the panel module) can rotate relative to the first module 12 (the host module) along a first direction D1 and a second direction D2 different from the first direction D1 via the biaxial pivoting mechanism 16, so the electronic device 10 can be switched to a tablet computer mode and a notebook computer mode according to user's demand. The first direction D1 is an obverse rotation or a reverse rotation surrounding Y axis, and the second direction D2 is an obverse rotation or a reverse rotation surrounding Z axis.

Figure 3:
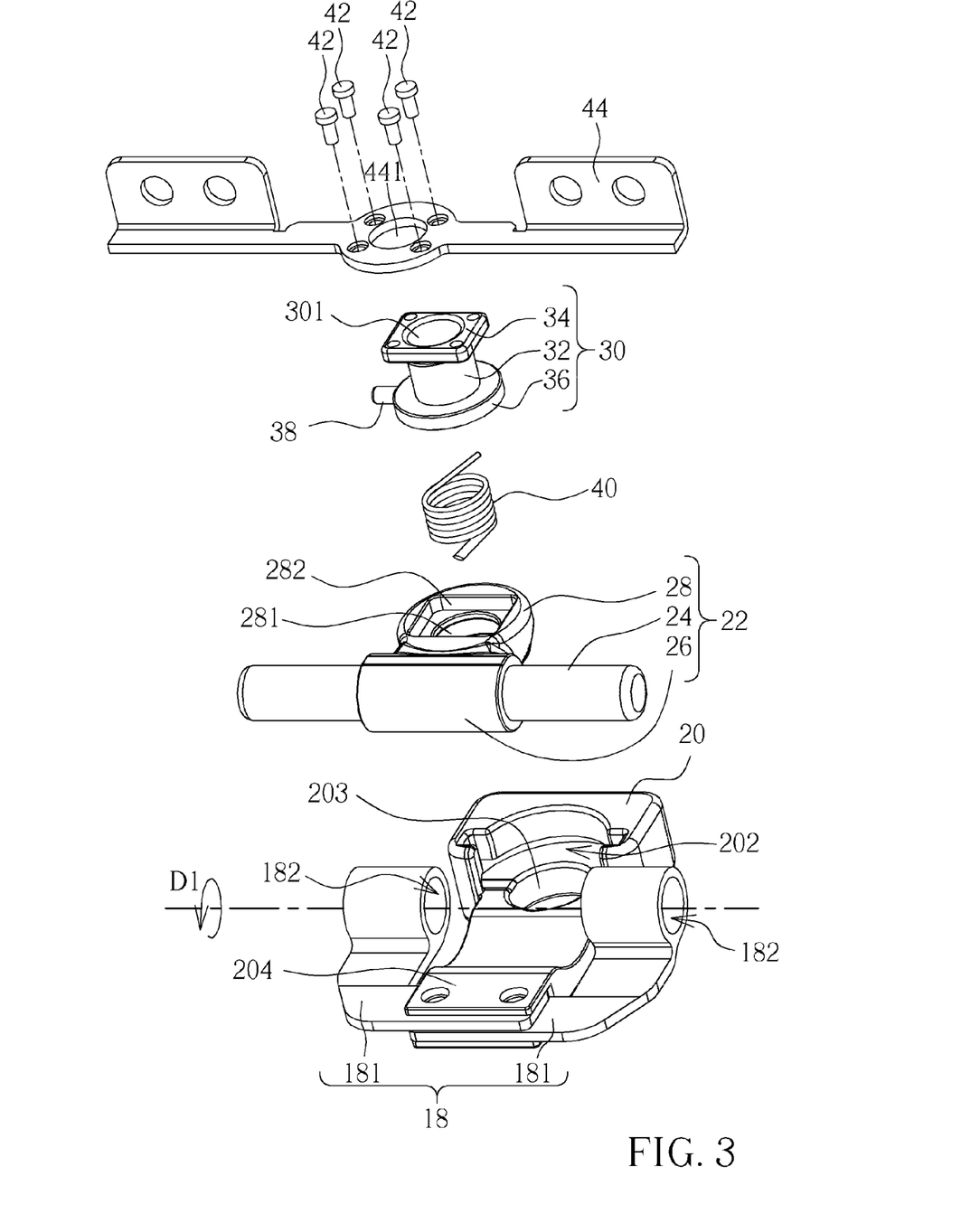
FIG. 3 is an exploded diagram of a biaxial pivoting mechanism according to the embodiment of the present invention.
Figure 4:
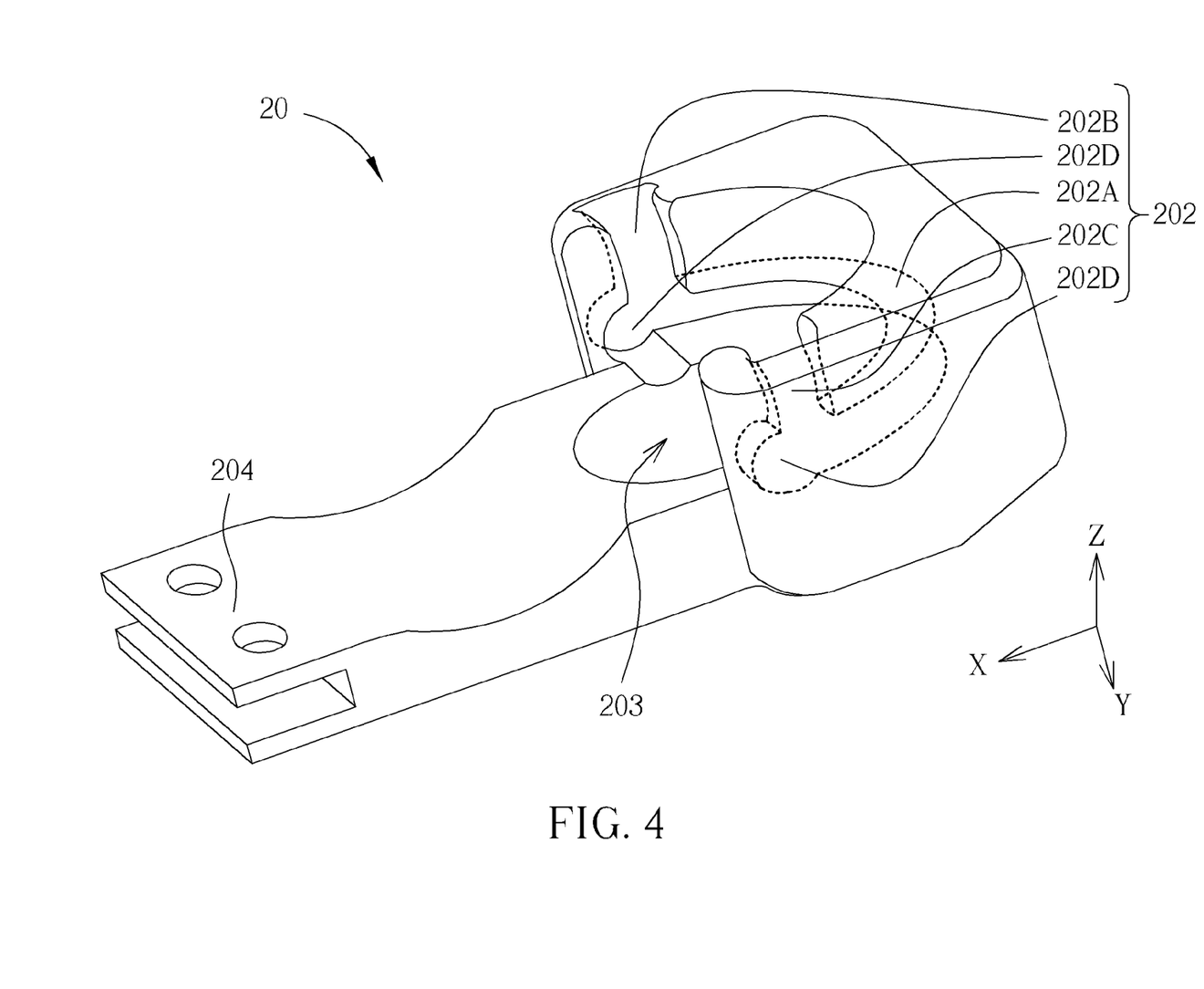
FIG. 4 is a diagram of a base according to the embodiment of the present invention.

Please refer to FIG. 3. FIG. 3 is an exploded diagram of the biaxial pivoting mechanism 16 according to the embodiment of the present invention. The biaxial pivoting mechanism 16 includes a supporter 18 disposed on the first module 12, a base 20 connected to the supporter 18, and a rotating component 22 disposed between the supporter 18 and the base 20. The supporter 18 can include two conjunction portions 181, each having a pivot hole 182. Please refer to FIG. 4. FIG. 4 is a diagram of the base 20 according to the embodiment of the present invention. A track 202 is formed on a lateral wall inside the base 20. The track 202 can include a first area 202A, a second area 202B connected to an end of the first area 202A, and a third area 202C connected to the other end of the first area 202A.

Structure of the track 202 is introduced as following. Directions of the second area 202B and the third area 202C can be substantially perpendicular to a direction of the first area 202a, which means the directions of the second area 202B and the third area 202C can be substantially parallel to X-Z plane, and the direction of the first area 202A can be substantially parallel to X-Y plane. Besides, the track 202 can further include two buffer areas 202D respectively disposed between the first area 202A and the second area 202B, and between the first area 202A and the third area 202C. A wire hole 203 can be formed on the base 20. The wire hole 203 is located on a bottom of the base 20, and can be passed through by a connecting cable disposed between the first module 12 and the second module 14. The base 20 can further include a buckling portion 204 for buckling ends of the conjunction portions 181, so as to constrain a movement of the base 20 relative to the supporter 18.

Figure 5:
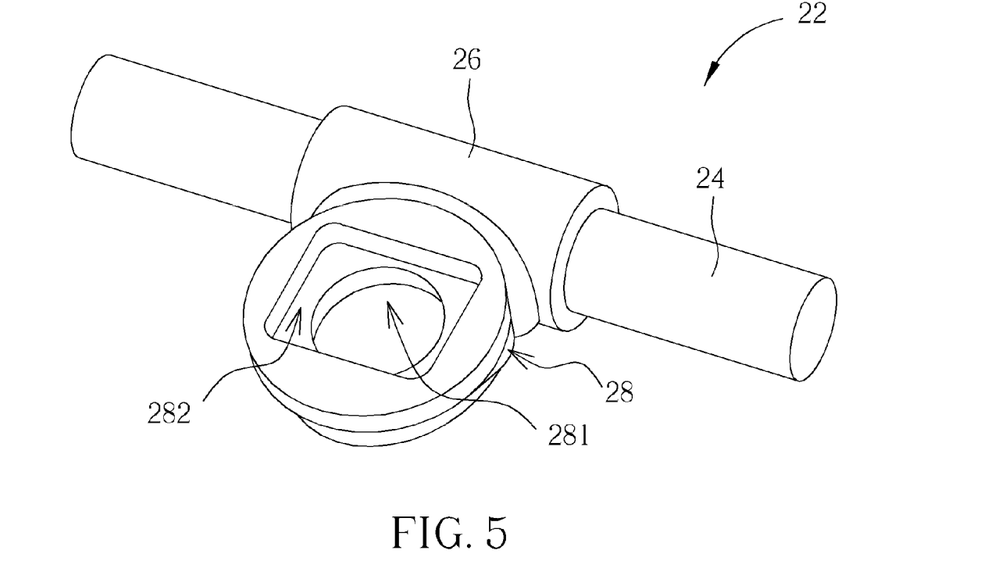
FIG. 5 and FIG. 6 respectively are diagrams of a rotating component in different views according to the embodiment of the present invention.
Figure 6:
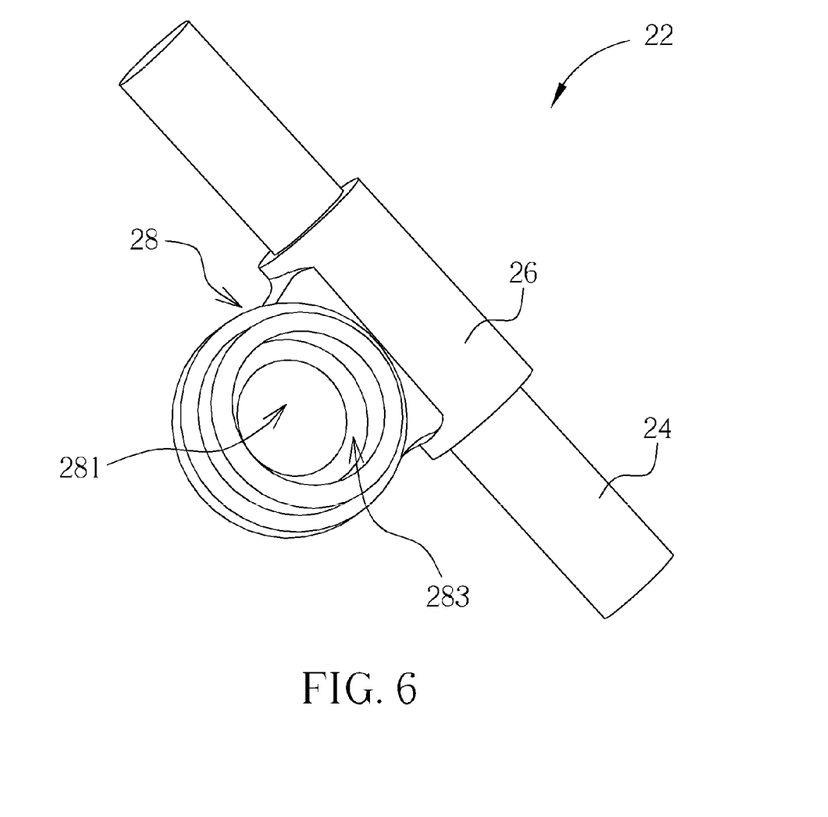

Please refer to FIG.5 and FIG.6. FIG.5 and FIG.6 respectively are diagrams of the rotating component 22 in different views according to the embodiment of the present invention. The rotating component 22 includes a shaft portion 24 pivoting to the supporter 18, a cover portion 26 disposed on a middle of the shaft portion 24, and a sheathing portion 28 connected to the shaft portion 24 via the cover portion 26. The conjunction portions 181 of the supporter 18 can be detached from each other to assemble the supporter 18 with the shaft portion 24 of the rotating component 22. The conjunction portions 181 respectively slide onto two ends of the shaft portion 24, and then the buckling portion 204 buckles the ends of the conjunction portions 181 for constraint. The conjunction portions 181 of the supporter 18 can be respectively disposed on two ends of the shaft portion 24 of the rotating component 22 through the pivot holes 182, so that the rotating component 22 can pivot relative to the supporter 18 via an assembly of the shaft portion 24 and the pivot holes 182.

In addition, a radial dimension of the cover portion 26 can be substantially greater than a radial dimension of the pivot hole 182 on the conjunction 181. The cover portion 26 can prevent the rotating component 22 from sliding relative to the supporter 18 (such as sliding along Y axis) when the rotating component 22 pivots relative to the supporter 18 along the first direction D1, as shown in FIG. 3, so that the sheathing portion 28 of the rotating component 22 can be disposed inside the base 20 accurately. Furthermore, a piercing hole 281 can be formed on the sheathing portion 28, and the connecting cable disposed between the first module 12 and the second module 14 can pierce through the piercing hole 281. A sunken slot 282 and an engaging slot 283 can be formed on the rotating component 22, and respectively located on two opposite sides of the sheathing portion 28. The piercing hole 281 can align with the sunken slot 282 and the engaging slot 283 for connection.

Figure 7:
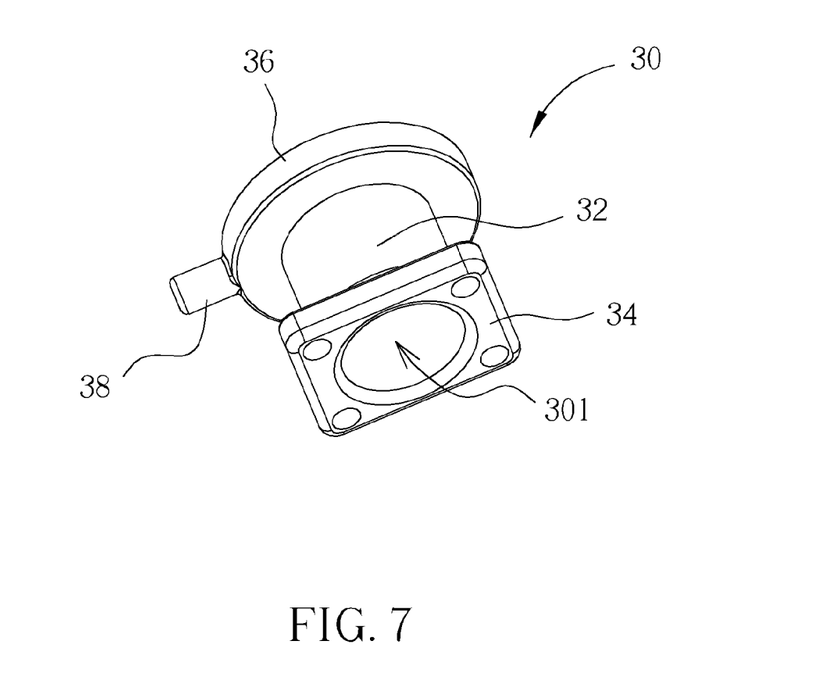
FIG. 7 and FIG. 8 respectively are diagrams of a sleeve in different views according to the embodiment of the present invention.
Figure 8:
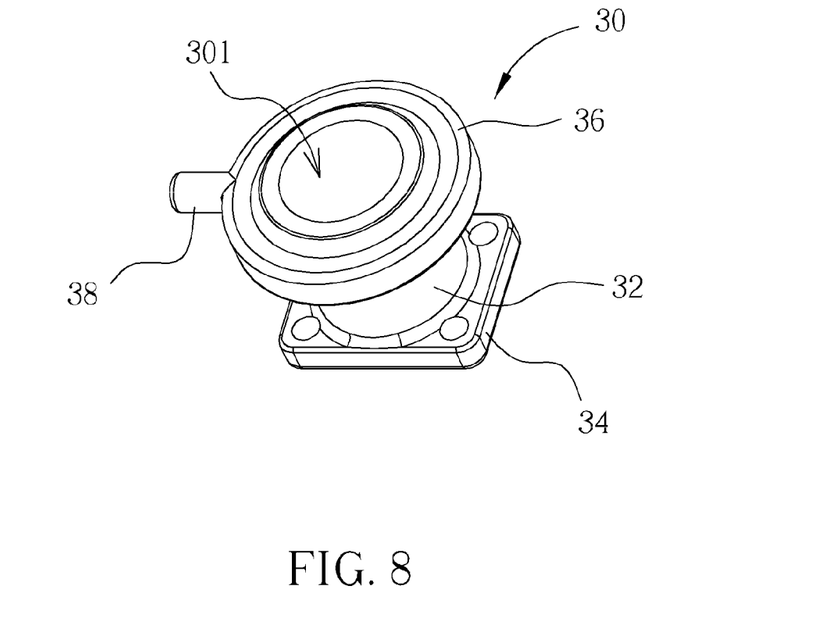

The biaxial pivoting mechanism 16 further includes a sleeve 30 slidably and rotatably disposed inside the piercing hole 281 on the sheathing portion 28. Please refer to FIG.7 and FIG.8. FIG.7 and FIG.8 respectively are diagrams of the sleeve 30 in different views according to the embodiment of the present invention. The sleeve 30 can include a pillar 32 piercing through the piercing hole 281 on the sheathing portion 28, a top portion 34 disposed on a top of the pillar 32, a bottom portion 36 disposed on a bottom of the pillar 32, and a protruding portion 38 disposed on an edge of the bottom portion 36. The pillar 32, the top portion 34 and the bottom portion 36 can be detached from each other to assemble the sleeve 30 with the rotating component 22. The pillar 32 can slide relative to the piercing hole 281 on the sheathing portion 28 along Z axis. The top portion 34 can be wedged inside the sunken slot 282 on the sheathing portion 28. A dimension and a shape of the top portion 34 correspond to a dimension and a shape of the sunken slot 282, such as a rectangle, so as to constrain a rotation of the pillar 32 relative to the sheathing portion 28 along the second direction D2.

It should be mentioned that a height of the pillar can be substantially greater than or equal to a thickness of the sheathing portion 28. The bottom portion 36 does not contact a bottom of the sheathing portion 28 when the rectangular top portion 34 is wedged inside the rectangular sunken slot 282. The bottom portion 36 can be pushed to contact the sheathing portion 28 when the sheathing portion 28 is accommodated inside the base 20. Meanwhile, the rectangular top portion 34 can be separate from the rectangular sunken slot 282, so the sleeve 30 can arbitrarily rotate relative to the rotating component 22 along the second direction D2.

When the rectangular top portion 34 is wedged inside the rectangular sunken slot 282 on the sheathing portion 28, the sleeve 30 can rotate relative to the supporter 18 along the first direction D1 with the rotating component 22. The protruding portion 38 of the sleeve 30 can slide inside the second area 202B (or the third area 202C) of the track 202. The second area 202B and the third area 202C can respectively be an arc structure. The protruding portion 38 can slide along the arc structure smoothly when the sleeve 30 rotates relative to the supporter 18 along the first direction D1 with the rotating component 22, so that the sheathing portion 28 can move in and move out of the base 20 stably. In addition, when the sheathing portion 28 is accommodated inside the base 20, and the rectangular top portion 34 is separated from the rectangular sunken slot 282 on the sheathing portion 28, the sleeve 30 can slide inside the first area 202A of the track 202 by the protruding portion 38, so as to rotate relative to the rotating component 22 and the base 20 along the second direction D2. The first area 202A can be a half-annular structure.

Therefore, a rotation range of the sleeve 30 relative to the base 20 along the second direction D2 corresponds to a dimension of the half-annular structure, which means the rotation range of the sleeve 30 relative to the base 20 can be substantially between 0 degrees and 180 degrees, so as to reverse the second module 14. Because the first area 202A is the half-annular structure, and the second area 202B and the third area 202C are the arc structures, the track 202 can form the buffer area 202D between the first area 202A and the second 202B (or the third area 202C), so the protruding portion 38 can slide from the half-annular structure to the arc structures easily. Furthermore, a wire hole 301 can be further formed on the sleeve 30. The wire hole 301 is formed across the pillar 32, the top portion 34 and the bottom portion 36 for being passed through by the connecting cable disposed between the first module 12 and the second module 14.

As shown in FIG. 3, the biaxial pivoting mechanism 16 can further include a resilient component 40 disposed between the sleeve 30 and the rotating component 22. The resilient component 40 can be a compressed spring disposed on the pillar 32 of the sleeve 30, and two ends of the resilient component 40 can respectively contact the engaging slot 283 on the sleeve 28 and the bottom portion 36 of the sleeve 30. A resilient recovering force of the resilient component 40 can slide the sleeve 30 relative to the sheathing portion 28 along Z axis, and the rectangular top portion 34 can be wedged inside the rectangular sunken slot 282, so as to constrain a rotation of the sleeve 30 relative to the sheathing portion 28 along the second direction D2.

Besides, the biaxial pivoting mechanism 16 can further include a plurality of fixing components 42 and a holder 44. The fixing component 42 can be a screw or a bolt for fixing the holder 44 on the rectangular top portion 34 of the sleeve 30. An opening hole 441 can be formed on the holder 44, and the opening hole 441 can align with the wire hole 301 on the sleeve 30 and the wire hole 203 on the base 20, so as to be passed through by the connecting cable disposed between the first module 12 and the second module 14. The holder 44 can hold the second module 14, and the second module 14 can utilize the biaxial pivoting mechanism 16 to rotate relative to the first module 12 along the first direction D1 or the second direction D2 for switching operation modes of the electronic device 10.

Figure 9:
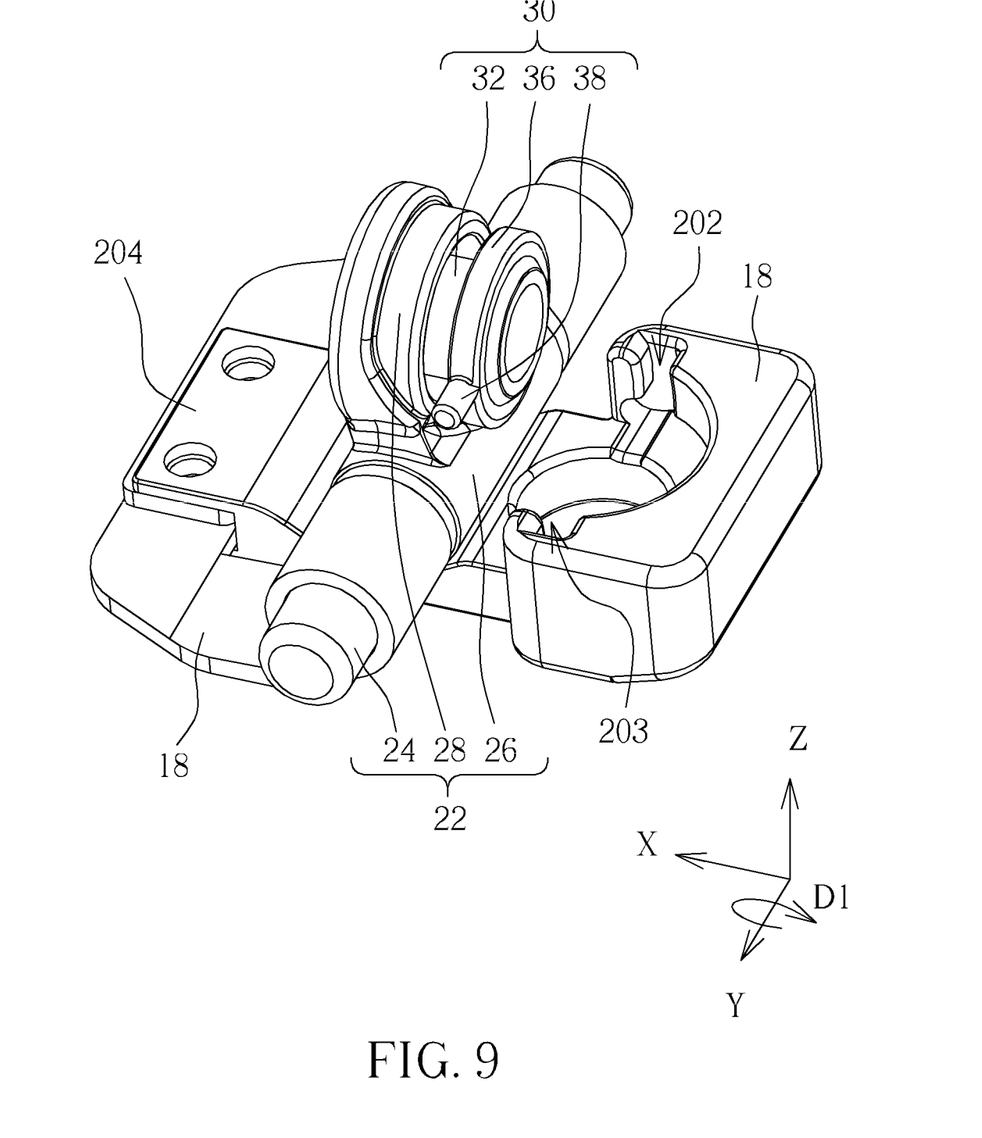
FIG. 9 and FIG. 10 respectively are diagrams of the biaxial pivoting mechanism in different operation modes according to the embodiment of the present invention.
Figure 10:
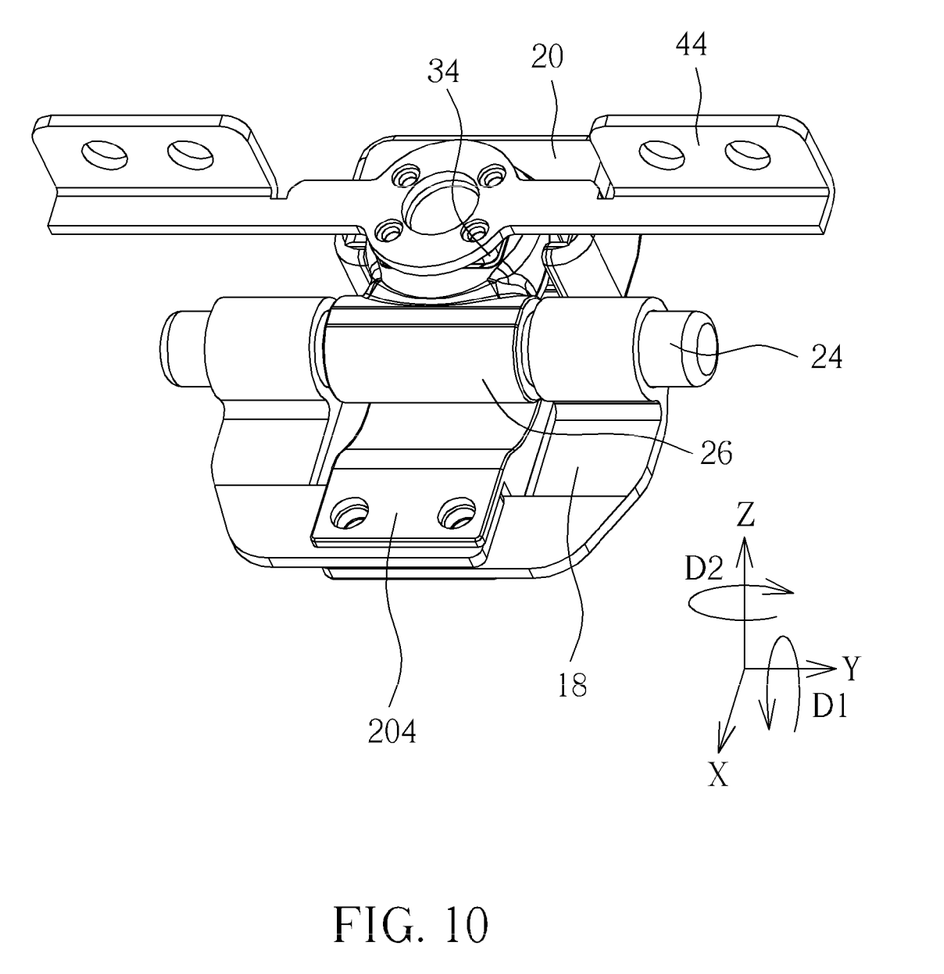
Figure 11:
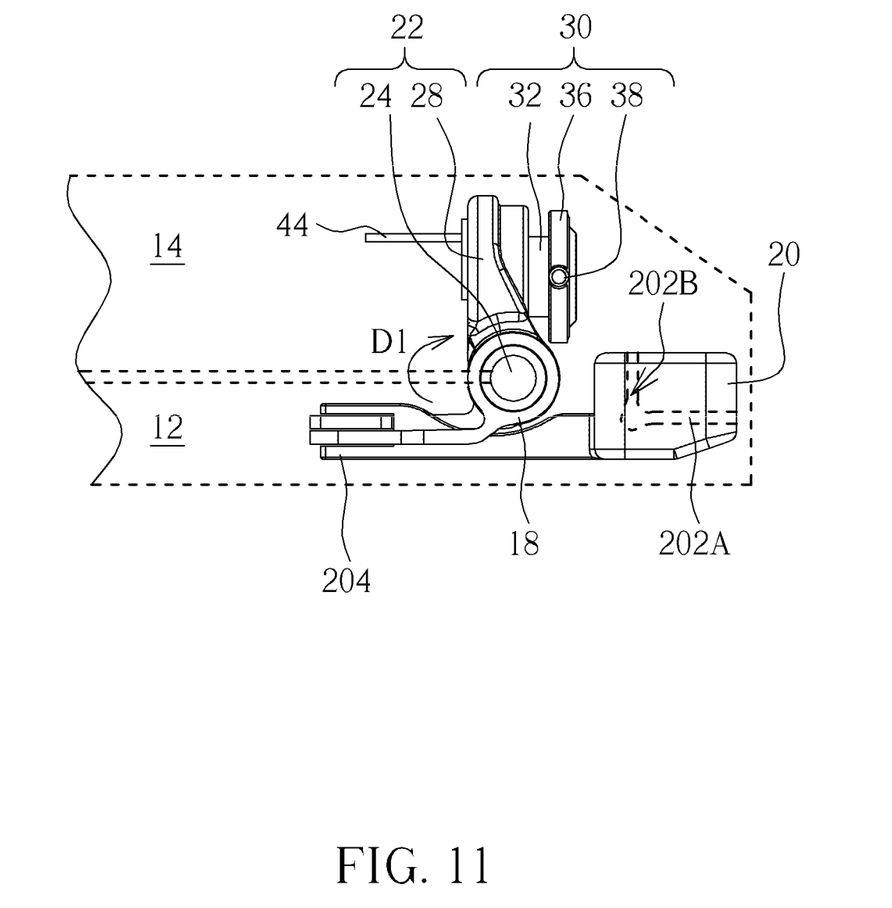
FIG. 11 is a sectional view of the biaxial pivoting mechanism shown in FIG. 9.
Figure 12:
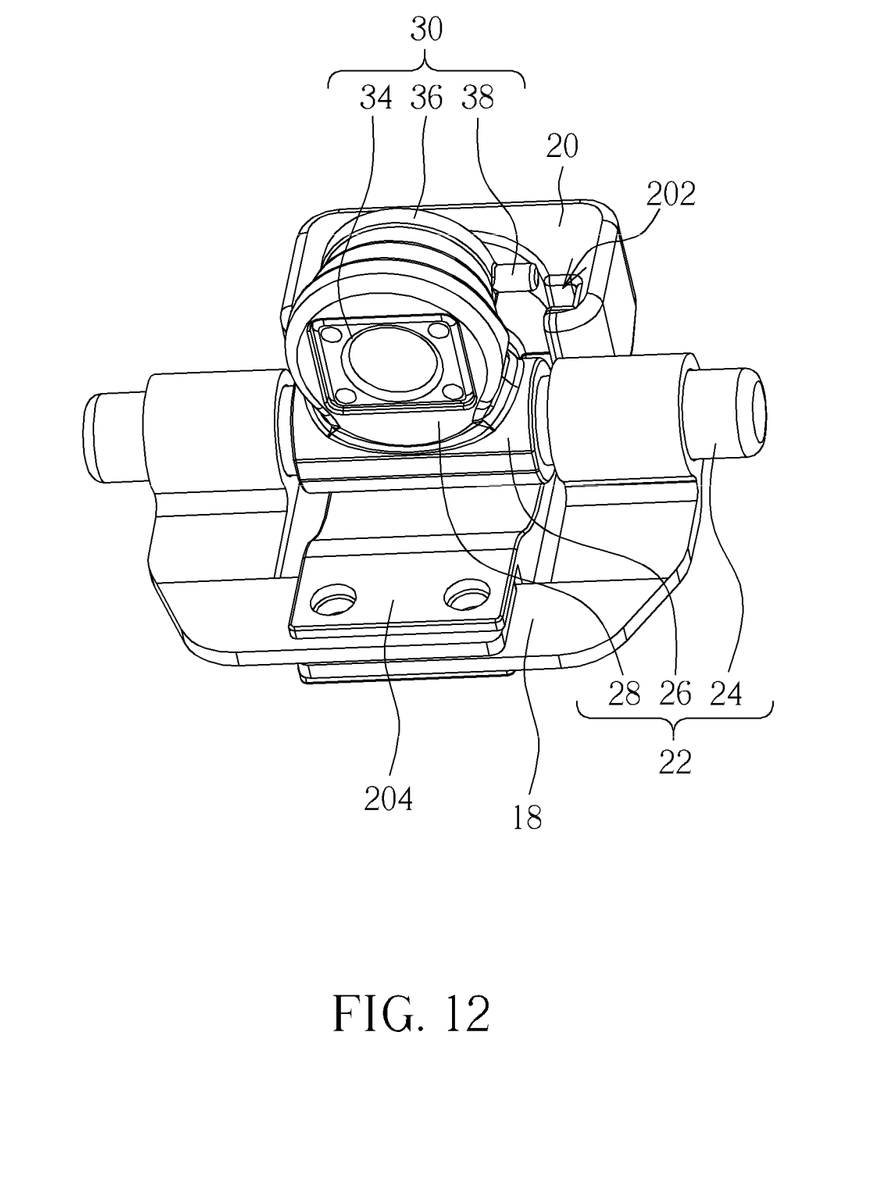
FIG. 12 is the other sectional view of the biaxial pivoting mechanism shown in FIG. 9.
Figure 13:
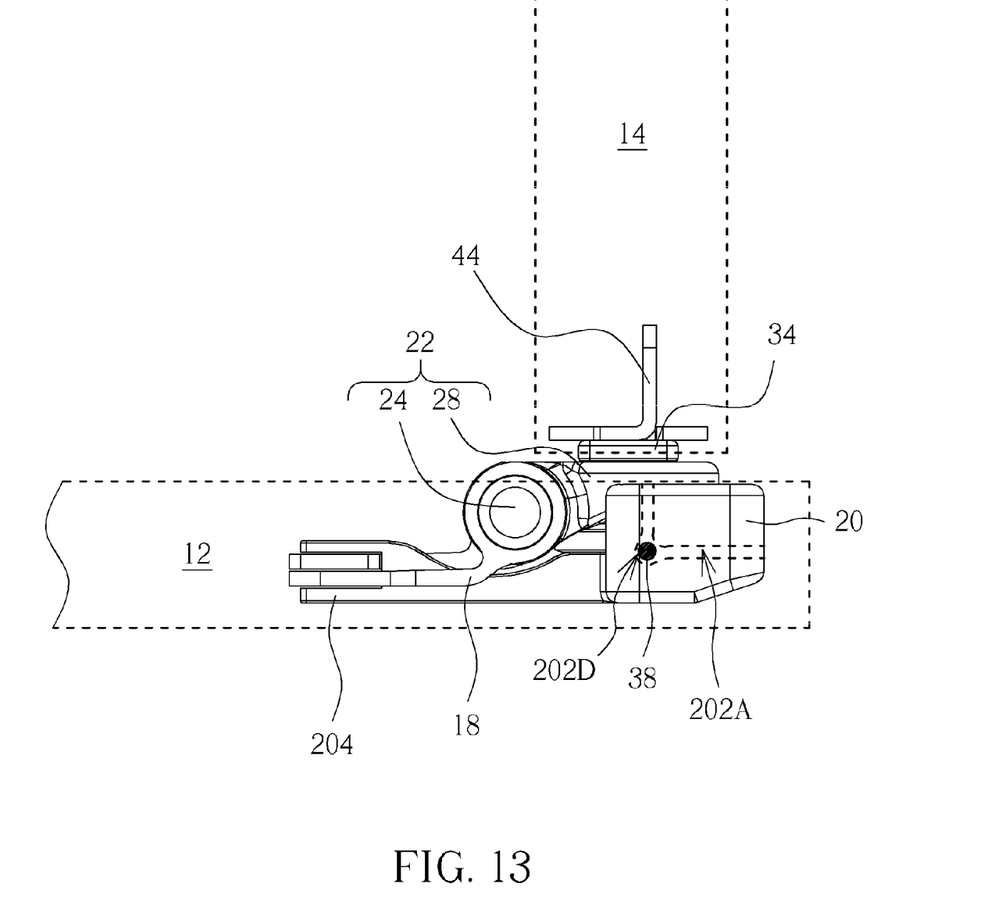
FIG. 13 is a sectional view of the biaxial pivoting mechanism shown in FIG. 10.

Please refer to FIG.9 to FIG.13. FIG.9 and FIG.10 respectively are diagrams of the biaxial pivoting mechanism 16 in different operation modes according to the embodiment of the present invention. FIG.11 is a sectional view of the biaxial pivoting mechanism 16 shown in FIG.9. FIG.12 is the other sectional view of the biaxial pivoting mechanism 16 shown in FIG.9. FIG.13 is a sectional view of the biaxial pivoting mechanism 16 shown in FIG.10. As shown in FIG.4, FIG.5, FIG.9, FIG.11 and FIG.12, the second module 14 can be put on an upper surface of the first module 12, which means the electronic device 10 can be the tablet computer mode or the closed notebook computer mode. The sheathing portion 28 of the rotating component 22 cannot be accommodated inside the base 20, the resilient recovering force of the resilient component 40 can move the sleeve 30 relative to the rotating component 22 along X axis, so that the bottom portion 36 can be separated from the sheathing portion 28 (which means the bottom portion 36 does not contact the engaging slot 283 on the sheathing portion 28), and the rectangular top portion 34 can be wedged inside the rectangular sunken slot 282 on the sheathing portion 28. Therefore, the sleeve 30 can not rotate relative to the sheathing portion 28 of the rotating component 22.

For switching the operation modes of the electronic device 10, the second module 14 can be moved away from the upper surface of the first module 12, to rotate the rotating component 22 relative to the supporter 18 along the first direction D1 (the X-Z plane), so the protruding portion 38 of the sleeve 30 can slide into the track 202 of the base 20, and move to a position shown in FIG. 10 and FIG. 13. The second area 202B (or the third area 202C) of the track 202 can be the arc structure, and the protruding portion 38 can smoothly move into the second area 202B (or the third area 202C) along an arc path by the shaft portion 24.

As shown in FIG. 10 and FIG. 13, the sheathing portion 28 can be accommodated inside the base 20 completely when the protruding portion 38 slides to an end of the second area 202B (or the third area 202C), and the bottom portion 36 of the sleeve 30 can upwardly move the pillar 32 and the rectangular top portion 34 relative to the piercing hole 281 on the sheathing portion 28 by a press along Z-axis, so that the rectangular top portion 34 can be separated from the rectangular sunken slot 282 on the sheathing portion 28. Meanwhile, the resilient component 40 disposed between the sleeve 30 and the rotating component 22 can be pressed to store the resilient recovering force. When the rectangular top portion 34 is separated from the rectangular sunken slot 282, the protruding portion 38 of the sleeve 30 is located inside the buffer area 202D. The second module 14 can be pushed to rotate relative to the first module 12 along the second direction D2, which means the protruding portion 38 can slide along the first area 202A of the track 202, and move from the second area 202B to the third area 202C (or from the third area 202C to the second area 202B), so the sleeve 30 can rotate relative to the rotating component 22 and the base 20 along the second direction D2 (the X-Y plane).

Because the first area 202A can be the half-annular structure, the sleeve 30 can substantially rotate relative to the rotating component 22 and the base 20 along the second direction D2 from 0 degree to 180 degrees, so as to reverse the second module 14. That is to say, the biaxial pivoting mechanism 16 not only can constrain a rotation of the holder 44 (and the sleeve 30) relative to the supporter 18 along the first direction D1 by an assembly of the protruding portion 38 and the track 202, but also can utilize the half-annular structure of the first area 202A to constrain the rotation range of the sleeve 30 relative to the sheathing portion 28 along the second direction D2.

In conclusion, the sleeve and the holder of the biaxial pivoting mechanism of the present invention can utilize an assembly of the shaft portion of the rotating component and the pivot hole on the supporter to rotate relative to the supporter, so that the second module of the electronic device can be folded and unfolded relative to the first module for adjusting a view angle of the second module (the panel module). In addition, the sheathing portion of the rotating component can be accommodated inside the base when the second module rotates relative to the first module at the maximum view angle, meanwhile, the protruding portion of the sleeve can slide into the second area and the buffer area of the track, and the bottom portion can be pushed to upwardly slide the pillar and the top portion relative to the sheathing portion for releasing the constraint of the top portion and the rectangular sunken slot on the sheathing portion. Therefore, the sleeve can be revolved on its own axis inside the piercing hole on the sheathing portion, which means the second module can be reversed to switch the operation modes of the electronic device, such as the tablet computer mode and the notebook computer mode. When the protruding portion of the sleeve slides along the first area of the track, the biaxial pivoting mechanism of the present invention can constrain the rotation of the sleeve relative to the supporter with the rotating component by the assembly of the protruding portion and the track, and the second module can not be folded and unfolded relative to the first module when the second module is revolved on its own axis.

When the protruding portion of the sleeve is located inside the second area (or the third area) and the buffer area of the track, the sleeve can pivot relative to the supporter with the rotating component. At this time, the biaxial pivoting mechanism of the present invention can utilize the resilient recovering force generated from the resilient component to separate the bottom portion of the sleeve away from the sheathing portion, so as to wedge the top portion inside the sunken slot on the sheathing portion. As the view angle of the second module relative to the first module is adjusted, the second module cannot execute coaxial rotation for reverse by the constraint of the top portion and the sunken slot. Thus, the electronic device of the present invention can utilize the biaxial pivoting mechanism to adjust the rotation angle of the second module relative to the first module, so as to vary the rotation angle of the second module relative to the first module, and the view angle of the second module in sequence. Besides, the supporter of the biaxial pivoting mechanism can be disposed on the first module, and the holder can be connected to the second module when assembling the electronic device, the structural elements of the base and the sleeve are not accommodated inside the first module and the second module, so that the biaxial pivoting mechanism of the present invention can be applied to a thin type portable computer for effectively decreasing a width and a thickness of the electronic device.

Comparing to the prior art, the biaxial pivoting mechanism of the present invention can rotate the second module relative to the first module along different directions, so that the electronic device can be switched to the tablet computer mode and the notebook computer mode according to user's demand. The biaxial pivoting mechanism of the present invention can pass the connecting cable through the holes on the above-mentioned elements for preferable structural strength, so as to keep stability of the first module and the second module. Therefore, the biaxial pivoting mechanism of the present invention has advantages of stable structure and preferred cover of the connecting cable, the biaxial pivoting mechanism has small volume for effectively economizing the structural space of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A biaxial pivoting mechanism comprising:
a supporter disposed on a first module;
a base connected to the supporter, a track being formed on a lateral wall inside the base;
a rotating component disposed between the supporter and the base, the rotating component comprising:
   a shaft portion pivoting towards the supporter; and
   a sheathing portion connected to the shaft portion, a piercing hole being formed on the sheathing portion, the sheathing portion pivoting relative to the supporter via the shaft portion along a first direction for accommodating inside the base;
a sleeve slidably and rotatably disposed inside the piercing hole on the sheathing portion, the sleeve comprising a protruding portion, the sleeve sliding inside the track by the protruding portion, so as to rotate relative to the rotating component along a second direction perpendicular to the first direction; and
a holder disposed on the sleeve for holding a second module so that the second module rotates relative to the first module along the first direction and the second direction.

2. The biaxial pivoting mechanism of claim 1, wherein the supporter comprises two conjunction portions, a pivot hole is formed on the conjunction portion, and the conjunction portions are respectively disposed on two ends of the shaft portion of the rotating component through the pivot holes.

3. The biaxial pivoting mechanism of claim 2, wherein the rotating component further comprises a cover portion disposed on a middle of the shaft portion, the sheathing portion is connected to the shaft portion via the cover portion, and a radial dimension of the cover portion is substantially greater than a radial dimension of the pivot hole on the conjunction portion.

4. The biaxial pivoting mechanism of claim 2, wherein the base comprises a buckling portion for buckling ends of the conjunction portions, so as to constrain a movement of the base relative to the supporter.

5. The biaxial pivoting mechanism of claim 1, wherein the track of the base comprises:
   a first area, the sleeve sliding inside the first area by the protruding portion so as to rotate relative to the rotating component and the base along the second direction;
   a second area connected to an end of the first area, the sleeve sliding inside the second area by the protruding portion so as to rotate relative to the supporter along the first direction with the rotating component; and
   a third area connected to the other end of the first area, directions of the second area and the third area being substantially perpendicular to a direction of the first area.

6. The biaxial pivoting mechanism of claim 5, wherein the track further comprises:
   a buffer area disposed between the first area and the second area.

7. The biaxial pivoting mechanism of claim 1, wherein a sunken slot and an engaging slot are formed on the rotating component, and are respectively located on two sides of the sheathing portion.

8. The biaxial pivoting mechanism of claim 7, wherein the sleeve further comprises:
   a pillar piercing through the piercing hole on the sheathing portion;
   a top portion disposed on a top of the pillar for wedging with the sunken slot, so as to constrain a movement of the pillar relative to the sheathing portion;
   a bottom portion disposed on a bottom of the pillar, the protruding portion being disposed on an edge of the bottom portion; and
   a fixing component for fixing the holder on the top portion of the sleeve.

9. The biaxial pivoting mechanism of claim 8, further comprising:
   a resilient component disposed between the sleeve and the rotating component, the resilient component being disposed on the pillar of the sleeve, and two ends of the resilient respectively contacting against the engaging slot on the sheathing portion and the bottom portion of the sleeve.

10. The biaxial pivoting mechanism of claim 1, wherein an opening hole is formed on the holder, wire holes are formed on the sleeve and the base, and the opening hole on the holder aligns with the wire holes on the sleeve and the base.

11. An electronic device comprising:
   a first module;
   a second module; and
   a biaxial pivoting mechanism disposed between the first module and the second module, the biaxial pivoting mechanism comprising:
      a supporter disposed on the first module;
      a base connected to the supporter, a track being formed on a lateral wall inside the base;
      a rotating component disposed between the supporter and the base, the rotating component comprising:
         a shaft portion pivoting towards the supporter; and
         a sheathing portion connected to the shaft portion, a piercing hole being formed on the sheathing portion, the sheathing portion pivoting relative to the supporter via the shaft portion along a first direction for accommodating inside the base;
      a sleeve slidably and rotatably disposed inside the piercing hole on the sheathing portion, the sleeve comprising a protruding portion, the sleeve sliding inside the track by the protruding portion, so as to rotate relative to the rotating component along a second direction perpendicular to the first direction; and
      a holder disposed on the sleeve for holding the second module so that the second module rotates relative to the first module along the first direction and the second direction.

12. The electronic device of claim 11, wherein the supporter comprises two conjunction portions, a pivot hole is formed on the conjunction portion, and the conjunction portions are respectively disposed on two ends of the shaft portion of the rotating component through the pivot holes.

13. The electronic device of claim 12, wherein the rotating component further comprises a cover portion disposed on a middle of the shaft portion, the sheathing portion is connected to the shaft portion via the cover portion, and a radial dimension of the cover portion is substantially greater than a radial dimension of the pivot hole on the conjunction portion.

14. The electronic device of claim 12, wherein the base comprises a buckling portion for buckling ends of the conjunction portions, so as to constrain a movement of the base relative to the supporter.

15. The electronic device of claim 11, wherein the track of the base comprises:
   a first area, the sleeve sliding inside the first area by the protruding portion so as to rotate relative to the rotating component and the base along the second direction;
   a second area connected to an end of the first area, the sleeve sliding inside the second area by the protruding portion so as to rotate relative to the supporter along the first direction with the rotating component; and
   a third area connected to the other end of the first area, directions of the second area and the third area being substantially perpendicular to a direction of the first area.

16. The electronic device of claim 15, wherein the track further comprises:
   a buffer area disposed between the first area and the second area.

17. The electronic device of claim 11, wherein a sunken slot and an engaging slot are formed on the rotating component, and are respectively located on two sides of the sheathing portion.

18. The electronic device of claim 17, wherein the sleeve further comprises:
   a pillar piercing through the piercing hole on the sheathing portion;
   a top portion disposed on a top of the pillar for wedging with the sunken slot, so as to constrain a movement of the pillar relative to the sheathing portion;
   a bottom portion disposed on a bottom of the pillar, the protruding portion being disposed on an edge of the bottom portion; and
   a fixing component for fixing the holder on the top portion of the sleeve.

19. The electronic device of claim 18, further comprising:
   a resilient component disposed between the sleeve and the rotating component, the resilient component being disposed on the pillar of the sleeve, and two ends of the resilient respectively contacting against the engaging slot on the sheathing portion and the bottom portion of the sleeve.

20. The electronic device of claim 11, wherein an opening hole is formed on the holder, wire holes are formed on the sleeve and the base, and the opening hole on the holder aligns with the wire holes on the sleeve and the base.

* * * * *